(12) United States Patent
Nieland et al.

(10) Patent No.: US 12,296,573 B2
(45) Date of Patent: May 13, 2025

(54) PRE-PACKAGE FOR A SMARTCARD, A SMARTCARD AND A METHOD OF FORMING THE SAME

(71) Applicant: LINXENS HOLDING, Mantes-la-Jolie (FR)

(72) Inventors: Carsten Nieland, Gotha (DE); Sven Döring, Dresden (DE)

(73) Assignee: LINXENS HOLDING, Mantes-la-Jolie (FR)

( * ) Notice: Subject to any disclaimer, the term of this patent is extended or adjusted under 35 U.S.C. 154(b) by 283 days.

(21) Appl. No.: 17/908,828

(22) PCT Filed: Mar. 4, 2020

(86) PCT No.: PCT/IB2020/000268
§ 371 (c)(1),
(2) Date: Sep. 1, 2022

(87) PCT Pub. No.: WO2021/176247
PCT Pub. Date: Sep. 10, 2021

(65) Prior Publication Data
US 2023/0136355 A1    May 4, 2023

(51) Int. Cl.
*H05K 1/02* (2006.01)
*B32B 37/22* (2006.01)
*G06K 19/077* (2006.01)
*H05K 1/11* (2006.01)

(52) U.S. Cl.
CPC ...... *B32B 37/223* (2013.01); *G06K 19/07701* (2013.01); *G06K 19/07718* (2013.01); *B32B 2425/00* (2013.01)

(58) Field of Classification Search
CPC ...... G06K 19/077; H05K 1/028; H05K 1/118; H05K 1/147; H05K 1/189
See application file for complete search history.

(56) References Cited

U.S. PATENT DOCUMENTS 11,151,437 B2 * 10/2021 Lowe ............... G06K 19/06196
11,347,993 B2 *  5/2022 Finn ................. G06K 19/07716
11,645,487 B2 *  5/2023 Lotya .................... G06K 19/02
                                                         235/492

(Continued)

FOREIGN PATENT DOCUMENTS

EP       0780007 B1 *  4/1999
EP       2 715 619 B1   5/2016
(Continued)

OTHER PUBLICATIONS

International Search Report and Written Opinion of the International Searching Authority for related International Application No. PCT/IB2020/000268, dated Jun. 17, 2020, 13 pages.

*Primary Examiner* — Hoa C Nguyen
(74) *Attorney, Agent, or Firm* — DITTHAVONG, STEINER & MLOTKOWSKI

(57) ABSTRACT

When forming smartcards or pre-forms thereof additional functionality may be implemented by, for instance, incorporating components, such as a display device, and the like, by preparing pre-packages separately from the rest of the pre-forms and subsequently inserting the pre-packages into the pre-forms, thereby achieving superior process robustness and production yield.

20 Claims, 4 Drawing Sheets

(56) References Cited

U.S. PATENT DOCUMENTS

| | | | |
|---|---|---|---|
| 2006/0226240 A1* | 10/2006 | Singleton | G06K 19/07345 235/492 |
| 2008/0237356 A1* | 10/2008 | Singleton | H05K 3/284 235/492 |
| 2010/0196674 A1 | 8/2010 | Vanderlip et al. | |
| 2015/0269472 A1* | 9/2015 | Finn | H01Q 7/00 343/870 |
| 2017/0132506 A1* | 5/2017 | Blythe | G06K 19/0772 |
| 2017/0213097 A1* | 7/2017 | Vogel | G06V 10/147 |
| 2017/0277936 A1* | 9/2017 | Slottner | G06V 40/1329 |
| 2018/0330221 A1* | 11/2018 | Fischer | B32B 5/26 |
| 2020/0034679 A1* | 1/2020 | Proye | H01L 23/49822 |

FOREIGN PATENT DOCUMENTS

| | | |
|---|---|---|
| EP | 3 168 788 A1 | 5/2017 |
| KR | 20190139441 A | 12/2019 |

\* cited by examiner

PRE-PACKAGE FOR A SMARTCARD, A SMARTCARD AND A METHOD OF FORMING THE SAME

TECHNICAL FIELD

The present invention generally relates to smartcards of any type, such as credit cards, payment cards, key cards, electronic labels, datapages of security documents, and the like, in which a card-type substrate includes electronic components for providing information and/or responding to external stimuli, and the like.

BACKGROUND ART

Usage of smartcards of such types as specified above has developed into a widespread concept for handling sensitive information. In recent developments, not only tamper resistance and superior security of information represent important aspects, but also the incorporation of increases functionality into card-type substrates is considered vital in order to meet the demands of the many aspects encountered in our complex society. For example, card-type substrates are increasingly used in managing financial transactions in the form of credit cards, payment cards, and the like. To this end, many types of smart cards have implemented therein more or less complex electronic components so as to impart specific capabilities to the smartcard, such as responding to external stimuli, providing and/or processing sensitive information, providing wireless connectivity, presentation of information, providing a pleasant outer appearance, and the like, depending on the overall requirements associated with the specific context, in which the smartcard is to be used.

Basically, a smartcard is typically composed of a plurality of material layers that are processed so as to form a substantially monolithic block of material that has incorporated therein any respective electronic components, such as one or more antennas, for instance, for imparting RFID (radio frequency identity) capabilities to the smartcard, electronic modules for storing and processing information, a corresponding network of electrical connections, additional components for inductively and/or capacitively interconnecting card-internal components, and the like. Consequently, a plurality of techniques have been developed aiming at connecting the various material layers so as to form the substantially monolithic material block while at the same time appropriately enclosing the relevant functional components. Due to the ongoing tendency of incorporating additional functionality into smartcards specific components in the form of discrete electronic components, optical components, power supply devices, and the like may have to be integrated into a smartcard, thereby contributing to significant additional complexity of the overall manufacturing process. For example, respective pre-forms of smartcards may have to be provided for a card manufacturer, which enable the incorporation of additional features, such as specific components in order to provide for customized smartcards having specific functionality. Many of these additional components have a substantially non-planar configuration, i.e., a configuration with increased height dimensions compared to the respective lateral dimensions of any such component, thereby necessitating significant efforts in incorporating these components into the card-type substrate, in particular, if certain specifications have to be met. Due to a highly competitive market in this technical field respective components may have to be incorporated on the basis of efficient volume production techniques, while at the same time guaranteeing a high degree of integrity with respect to tamper resistance and robustness of smartcards in view of any environmental influences and mechanical stress in order to achieve a required long lifetime of any such smartcards.

In conventional approaches additional electronic components, such as display devices, are typically incorporated into a smartcard by appropriately preparing the individual card layers, for instance by forming respective openings in some of the layers and inserting the respective components, i.e. the integrated circuit chips and the display, and laminating the respective layers on the basis of appropriate process conditions. Thereafter, final process steps may be applied, for instance, by incorporating customized print areas, endowing the smartcard with a desired outer appearance, and the like. These final process steps are typically carried out from the end manufacturer based on a pre-form of the smartcard that has already incorporated therein the electronic chips and the display device. Consequently, in particular upon manufacturing the pre-form of smartcards so as to include complex additional components, such as display devices, a highly complex process sequence has to be implemented, wherein in particular respective manufacturing tolerances associated with the incorporation of the display device into the individual card layers may result in reduced overall production yield and/or reduced reliability of the final smartcard.

In view of the situation described above it is therefore an object of the present invention to provide increased flexibility in incorporating additional components into a pre-form of a smartcard, while eliminating or at least reducing one or more of the problems identified above.

DISCLOSURE OF THE INVENTION

In view of the technical problem identified above the present invention is generally based on the concept that increased precision in fabricating complex pre-forms of smartcards and thus perspective final smartcards may be accomplished by decoupling the basic process of forming a pre-form of a smartcard and the process of incorporating complex additional components, such as a display and/or a battery and/or a keyboard and/or a sensor and/or an optical component. To this end, a pre-package is formed as a separate component, which is formed on the basis of lateral dimensions and a height dimension that are selected in correspondence with the component to be incorporated without having to take into consideration the final dimensions and height dimensions of the pre-form of the smartcard and the final smartcard. Furthermore, process steps for incorporating the respective components into the pre-package, such as parameters for a lamination process, may specifically be adapted to the additional components substantially without affecting other areas of the pre-form of the smartcard. Consequently, respective processes and materials may specifically adapted to and thus optimized for the requirements of the component to be incorporated, while still providing for a high degree of consistency between materials of the pre-package and the actual pre-form of the smartcard.

It is to be noted that the term "smartcard", as used in this specification, is to be understood so as to cover any type of card-type substrate that includes electronic components for providing information and/or responding to external stimuli. Specific examples of smartcard according to the foregoing definition in particular comprise credit cards, payment cards, key cards, electronic labels, datapages of security documents, such as ePassports, and the like.

According to one aspect of the present invention, the above-specified technical object is solved by a pre-package for a smartcard. The pre-package includes a flexible printed circuit board that includes at least one non-planar circuit portion. The pre-package further includes a stack of material layers that accommodates the flexible printed circuit board to provide a top surface and a bottom surface of the stack of material layers that are planar.

According to this configuration of the pre-package, which is to be considered as a separate component at an early manufacturing stage of a corresponding smartcard, the flexible printed circuit board is appropriately shaped in a three-dimensional configuration in order to provide the at least one non-planar circuit portion. Consequently, respective complex components, such as a display, a battery, an optical component, a switch or keyboard, and the like may be positioned within the at least one non-planar circuit portion, while nevertheless the stack of material layers accommodating the flexible printed circuit board provides for planar top and bottom surfaces, thereby facilitating the further processing of the pre-package, for instance upon incorporating the pre-package into the respective pre-form of a smartcard.

In a further illustrative embodiment, the pre-package has predetermined lateral dimensions that are defined by the top surface and the bottom surface. That is, the lateral dimensions of the pre-package may be precisely determined on the basis of the material layer stack, i.e. on the basis of its bottom and top surface, thereby achieving a high degree of precision upon determining the lateral outer dimensions of the pre-package, which in turn enables a precise incorporation into a pre-form of a smartcard, thereby significantly reducing any manufacturing tolerances that may conventionally be associated with the incorporation of complex electronic components into a smartcard.

In a further illustrative embodiment, the pre-package has a height dimension, i.e., a dimension that is orthogonal to the lateral dimensions, which have a value of less than 0.8 millimeters (mm). Consequently, the pre-package may be fabricated to fit into dimensions of many conventional smartcards without adding additional height or thickness to such cards. In particular, embodiments, the thickness or height of the pre-package may be approximately 0.6 millimetres and even less, thereby allowing the incorporation of the pre-package into standard smartcards used as credit cards, payment cards, key cards, and the like.

In a further illustrative embodiment, at least a material that forms a portion of the top surface and/or the bottom surface is a material as is also used for smartcards. Consequently, in addition to the substantially planar surface configuration provided by the bottom and top surfaces also the material composition of at least one of these surfaces or portions thereof ensures material and/or process consistency with smartcards and respective pre-forms thereof. Consequently, as discussed above, upon incorporating the pre-package into a smartcard or a pre-form thereof, desired continuous material characteristics between the pre-package and the remaining part of the smartcard or the pre-form may be achieved.

In a further illustrative embodiment, the material that forms portions of the top surface and/or the bottom surface includes at least one of polyvinyl chloride (PVC) and polycarbonate and other materials, typical to be used with smartcards. That is, at least portions of the top surface and/or the bottom surface are formed of materials that are typically used in fabricating smartcards, as discussed above. Therefore, when providing the pre-package as a separate component of a smartcard the respective processing of the surface materials, for instance in the form of PVC or polycarbonate, may specifically be adapted to the requirements of the additional components, for instance when selecting appropriate process parameters in terms of pressure, temperature and process duration during a lamination process, while the remaining part of a respective smartcard or a pre-form thereof may be processed on the basis of different process conditions, if required.

In some illustrative embodiments the flexible printed circuit board includes a display and/or a keyboard and/or a sensor and/or at battery and/or an optical and/or electronic component. Consequently, a required degree of complexity of a respective smartcard due to superior functionality may be provided without being associated with respective process restrictions that may be imposed upon processing a smartcard or a pre-form thereof in its entirety, since the pre-package may be formed on the basis of a significantly smaller form factor and on the basis of appropriately selected process parameters.

In a further illustrative embodiment, the stack of layers includes a frame layer that surrounds at least a portion of the at least one non-planar circuit portion. By incorporating the frame layer, respective components positioned in the non-planar circuit portion may appropriately be mechanically stabilised while additionally a certain degree of levelling with respect to the layers outside the non-planar circuit portion may be achieved. In this manner, appropriate process parameters, for instance in terms of mechanical pressure to be applied during a lamination process, may be selected without unduly affecting the one or more components positioned within the non-planar circuit portion.

In a further illustrative embodiment, the stack of material layers includes a top layer that forms at least a portion of the planar top surface and includes a bottom layer forming at least a portion of the planar bottom surface. In this case, the bottom layer and the top layer of the layer stack are selected to provide the planar surface areas without requiring any further process steps, since the desired planar surface configuration may be obtained by the layer stack itself, i.e. by the respective top and bottom layers.

In a further illustrative embodiment, the top layer and/or the bottom layer include a window portion that is aligned to at least a portion of an opening of the frame layer. That is, the frame layer, which laterally encloses at least a portion of the non-planar circuit portion and thus of a corresponding component positioned therein, enables "access" to the corresponding component by means of the window.

In this context the term "access" is to be understood as describing any type of interaction offer the component with the environment, for instance by providing visibility, enabling direct or indirect mechanical or electrical contact, and the like.

In a further illustrative embodiment, the pre-package includes a frame sidewall structure that laterally encloses a central portion of the stack of material layers, wherein the frame sidewall structure is laterally aligned to the top surface and the bottom surface to define the predetermined lateral dimensions throughout a height direction of the pre-package. Consequently, the frame sidewall structure results in an efficient lateral confinement of the non-planar circuit portion and thus of any components positioned therein, while also ensuring precise lateral dimensions throughout the overall height or thickness of the pre-package. Consequently, upon further processing the pre-package, i.e. upon incorporating the pre-package into a smartcard or a pre-form thereof, the precisely defined lateral dimensions throughout the entire thickness of the pre-package reduce overall process tolerances and enable a precise positioning of the pre-package within the smartcard or its pre-form.

According to a further aspect of the present invention, the above-identified technical object is solved by a precursor sheet material for forming smartcards. The precursor sheet material includes an array of pre-packages, which have the characteristics as specified above. Additionally, the precursor sheet material includes a substrate material that mechanically interconnects the pre-packages of the array. As already discussed above, providing a plurality of pre-packages in the form of an array that is interconnected by a substrate material enables a very efficient overall processing of the pre-packages, for instance by cutting the pre-packages and inserting the respective individual pre-packages into perspective smartcards or pre-forms thereof.

In one illustrative embodiment, the precursor sheet material is provided in the form of a roll material. Consequently, the supply of pre-packages is accomplished in a highly space-efficient manner, thereby enabling the usage of volume production techniques, while still maintaining a high degree of process precision.

According to a further aspect of the present invention, the above-identified object is solved by a smartcard that includes a stack of cards layers and a pre-package that is embedded in the stack of cards layers and that has the features as previously discussed. In this manner, is also explained before, the pre-package having the precisely defined lateral dimensions and the height dimension may be positioned within the stack of cards layers with high precision, while additionally enabling the fabrication of the smartcard pre-form on the basis of pre-form specific process conditions without affecting the fabrication and thus the characteristics of the pre-package.

In a further illustrative embodiment of the smartcard the stack of card layers includes a printed portion formed of a first material, wherein a portion of the pre-package positioned adjacent to the printed portion is formed of a second material that has substantially same thermal characteristics as the first material. That is, when forming the smartcard on the basis of the pre-package, as specified above, adjacent portions of the pre-package and the smartcard may exhibit similar thermal characteristics, thereby ensuring at least consistency in terms of optical appearance between the neighbouring portions when forming a printed area, and the like, since in particular thermal characteristics of the card material may have an influence on the finally obtained characteristics of the adjacent material areas. In a preferred embodiment, the first and second materials are substantially identical in their basic chemical composition.

In one illustrative embodiment, the pre-package has a window and the smartcard includes a card window that is at least partially aligned with the window of the pre-package. In this manner, the non-planar circuit portion and thus any component positioned therein may be "accessed" by means of the card window and the window of the pre-package. It should be appreciated that "access" of the non-planar circuit portion may include the presence of an optically transparent material in the card window, when visibility of at least a portion of the component is sufficient for "accessing" the component. In other cases, the window may include the absence of any material, if direct contact to an inner layer of the smartcard associated with the non-planar circuit portion is required.

According to further aspect of the present invention, the above-identified technical object is solved by a method of forming pre-packages for smartcards. The method includes the step of providing an array of flexible printed circuit boards that are mechanically interconnected by a carrier material, wherein each of the flexible printed circuit boards includes at least one non-planar circuit portion. The method further includes the step of attaching the array of flexible printed circuit boards to a first layer of a smartcard compatible material. Furthermore, the method includes laterally enclosing at least the non-planar circuit portion of each of the flexible printed circuit boards in the array by attaching, for each of the non-planar circuit portions, a respective frame layer to the first layer, wherein each of the frame layers has an opening so as to accommodate at least the respective non-planar circuit portion and so as to level, at least partially, a non-planarity of the respective non-planar circuit portion. Furthermore, the method includes the step of attaching a second layer formed of the smartcard compatible material to the first layer to form a planar bottom surface. Finally, the method includes the step of attaching a third layer formed of the smartcard compatible material to the frame layer to form a planar top surface. Consequently, the inventive method describes a technique for incorporating the flexible printed circuit board into a material layer stack, at least the top layer and the bottom layer of which are provided in the form of a smartcard compatible material. In this manner, the pre-package may be formed as a separate component as already discussed above, while still exhibiting material consistency with the smartcard of interest.

In a further illustrative embodiment, the method includes the step of preparing, in advance, the frame layers in accordance with lateral dimensions and a height dimension of the flexible printed circuit boards. Consequently, depending on design requirements, the frame layers are prepared so as to achieve lateral enclosure and/or to act as height levelling component, and are fabricated in a separate process step without affecting other components of the pre-package.

In an additional illustrative embodiment, the array of flexible printed circuit boards is provided in the form of a roll material and the first, second and third layers formed of the smartcard compatible material are each provided in the form of a roll material. In this manner, volume production techniques may be efficiently implemented while still achieving a high degree of precision upon forming the pre-packages, which in turn directly translates into increased reliability and superior process yield upon forming smartcards based on the pre-packages, as also discussed above.

BRIEF DESCRIPTION OF THE DRAWINGS

Further illustrative embodiments and other aspects of the present invention will be described in more detail in the following specification, while also referring to the accompanying drawings, in which FIG. 1 schematically illustrates an exploded cross-sectional view of a pre-package according to illustrative embodiments, FIG. 2 schematically illustrates an exploded cross-sectional view of a pre-package with a corresponding flexible printed circuit board being omitted according to illustrative embodiments, FIG. 3 schematically illustrates a top view of the plurality of pre-packages formed on a carrier material that is provided as a roll material according to illustrative embodiments, FIG. 4 schematically illustrates a top view of a precursor sheet material including a plurality of smartcard pre-forms for receiving respective pre-packages and FIGS. 5A and 5B schematically illustrate a top view and a cross-sectional view of a smartcard including a pre-package according to illustrative embodiments.

BEST MODE(S) FOR CARRYING OUT THE INVENTION

The present invention will now be described in more detail while referring to the accompanying drawings.

Figure 1:
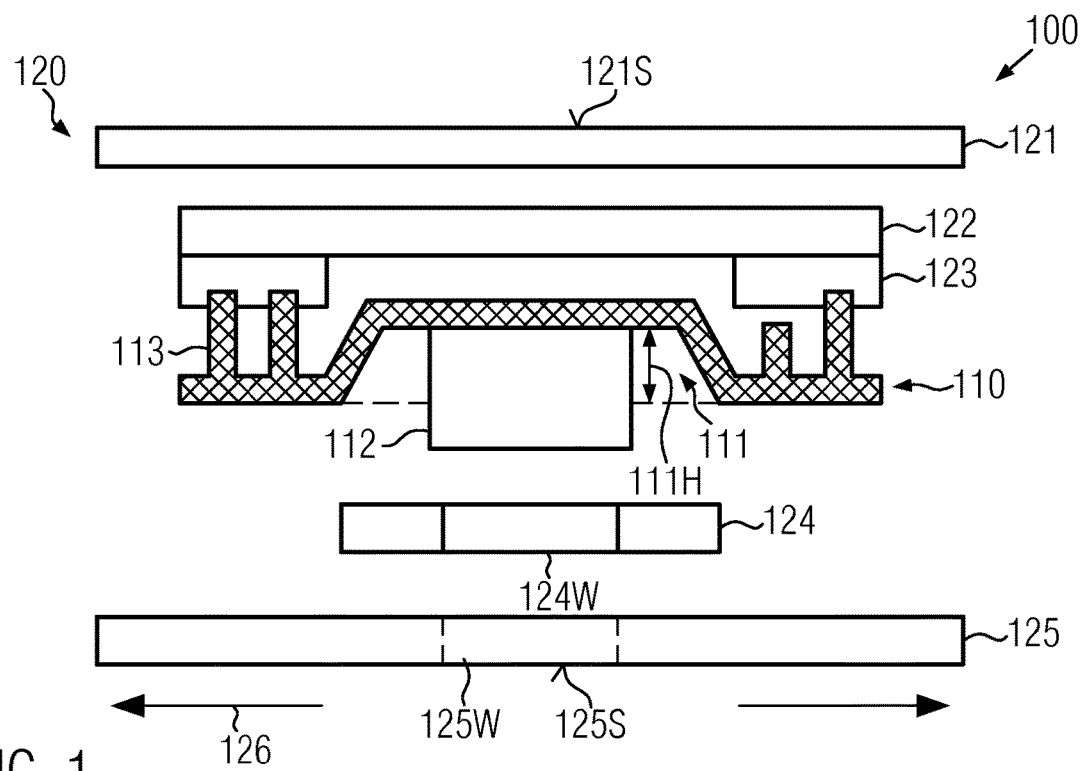

FIG. 1 schematically illustrates an exploded cross-sectional view of a pre-package 100 according to illustrative embodiments of the present invention. As illustrated, the pre-package 100 includes a flexible printed circuit board 110 that has a substantially non-planar circuit portion 111, which is to be understood as a circuit portion, substrate material of which is elevated or recessed, depending on one's point of view, so as to form a step-like configuration with a height 111H. The non-planar circuit portion 111 may include one or more components, which cannot readily integrated into a corresponding integrated circuit chip (not shown). Such one or more integrated circuit chips may be included in or on the flexible printed circuit board 110 or may be positioned at any other appropriate location within the pre-package 100. For example, respective one or more circuit chips may be positioned on or within material layers 122, 123, which may be appropriately sized and shaped to accommodate at least the non-planar circuit portion 111. Furthermore, the flexible printed circuit board 110 may include appropriate contact elements 113, which may connect to respective counterparts (not shown) in one of the layers 123, 122 so as to establish mechanical and electrical connections between the flexible printed circuit board 110 and the one or more circuit chips or any other substantially two-dimensional electronic components provided in the layers 123 and/or 122.

The non-planar circuit portion 111 may include any appropriate components, such as a display and/or a keyboard or individual press buttons and/or energy storage, such as a battery, and/or an optical component, and the like. The height 111H of the non-planar circuit portion 111 is advantageously selected such that the height dimension of the component 112 is at least partially compensated for. Furthermore, at the side of the component 112 a frame layer 124 is positioned and has a lateral dimension that corresponds to the non-planar circuit portion 111 in order to laterally enclose the component 112. Furthermore, the frame layer 124 may include an opening 124W that exposes at least a portion of the component 112. Consequently, the frame layer 124 acts to laterally enclose and thus stabilise the component 112. The frame layer 124 may also serve to level, at least to a certain degree, a difference of height levels between the component 112 and planar portions of the flexible printed circuit board 110.

Furthermore, the pre-package 100 includes a top layer 121 having a top surface 121S, which is a substantially planar surface made of any appropriate material. For example, the top layer 121 may represent a smartcard compatible material, for instance in the form of PVC (polyvinyl chloride), polycarbonate, and the like, possibly in combination with an appropriate coating (not shown), thereby contributing to consistent material characteristics between the pre-package 100 and respective smartcard or pre-form thereof, into which the pre-package 100 is to be inserted in a later manufacturing stage. Similarly, the pre-package 100 includes a bottom layer 125, which may also represent a smartcard compatible material, possibly in combination with a respective coating, in order to provide for consistency of material characteristics in connection with a smartcard or pre-form thereof. Furthermore, a bottom surface 125S of the layer 125 may represent a substantially planar surface, in order to ensure superior processing upon inserting the pre-package into a smartcard or pre-form thereof, as discussed above. In the embodiment shown, the bottom layer 125 includes a window 125W that is aligned to the opening 124W of the frame layer 124, thereby providing access to at least a portion of the component 112, wherein the term "access" is to be understood in the above-defined sense.

Consequently, the pre-package 100 includes a stack of material layers 120, including the layers 121 that provides for the planar top surface 121S, the layers 122, 123 to be attached to the flexible printed circuit board 110, the frame layer 124 and the bottom layer 125 providing the planar bottom surface 125 is, as discussed above. Moreover, the lateral dimensions, in FIG. 1 indicated as dimension 126 along one lateral direction, are precisely defined by the bottom and top surfaces 125S, 121S so that the lateral size and shape of the pre-package 100 is defined in a precise manner, thereby reducing undue manufacturing tolerances when implementing the component 112 in a respective smartcard or a pre-form thereof.

Figure 2:
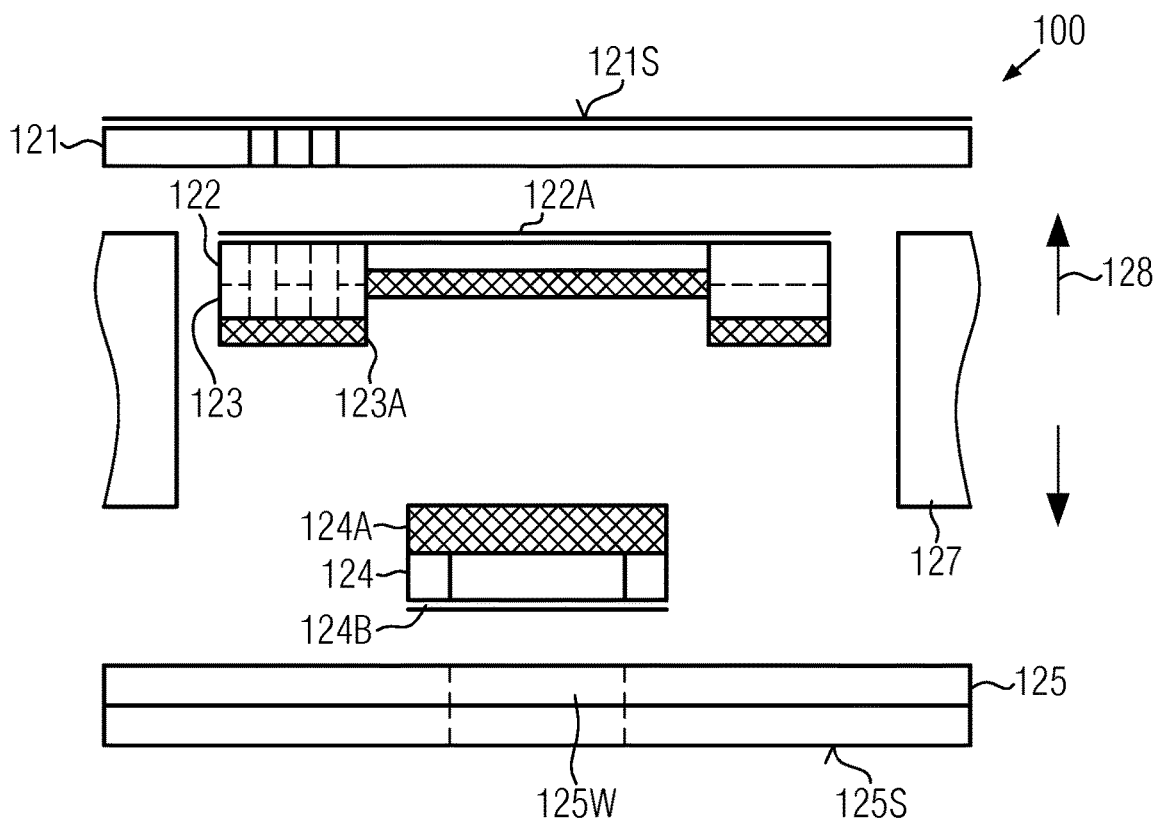

FIG. 2 schematically illustrates an exploded cross-sectional view of the pre-package 100 with the flexible printed circuit board 110 (cf. FIG. 1) being omitted. As illustrated, the top surface 121S may be provided in the form of a coating applied to the top layer 121, which in some illustrative embodiments is provided in the form of a PVC layer of a thickness of approximately 100 μm. Similarly, the bottom layer 125 is provided as a PVC material with a thickness of approximately 100 μm followed by respective coating in order to form the bottom surface 125S.

It should be appreciated that the composition of the layers 121, 125 as well as the thickness thereof are merely examples, and these aspects may be adapted to the specific use case.

The layers 122, 123 may be formed of any appropriate material, such as a smartcard compatible material in the form of PVC, polycarbonate, and the like, with a thickness of approximately 100 μm for each of the layers 122, 123. Furthermore, a coating 122A may be formed on the free surface of the layer 122, while a free film any appropriate composition, for instance in the form of adhesive material, and the like, may be provided on the free surface of the layer 123. Similarly, the frame layer 124 may have formed thereon a free film in the form of adhesive material so as to connect to the component 112 (cf. FIG. 1), while the opposing surface of the frame layer 124 may be covered by an appropriate coating 124S to be connected to the bottom layer 125.

In addition, in this case it should be appreciated that the composition of the layers 122, 123, 124 as well as the thickness thereof are merely examples, and these aspects may be adapted to the specific use case.

Moreover, a frame structure 127 may be provided so as to laterally connect to the layers 122, 123, wherein a height 128 of the frame structure 127 may be selected so as to correspond to the height and thickness of the layers 122, 123 and the corresponding coatings formed thereon as well as to the thickness and height of the flexible printed circuit board 110 including the component 112 (cf. FIG. 1) with the frame layer 124 attached thereto. For example, the height dimension 128 may range from approximately 300 μm to 350 μm, when the pre-package 100 is to be incorporated into a standard smartcard to be used as any type of payment card, which may have to comply with respective international standards. In other cases, the height 128 may be adapted to the specific use case in consideration.

In illustrative embodiments the frame structure, for instance formed of any appropriate smartcard compatible material, such as PVC, polycarbonate, and the like, may have a configuration such that the lateral dimensions defined by the top and bottom surfaces 121S, 125S are continued along the entire height of the pre-package 100. Consequently, the lateral dimensions along the entire height or thickness of the pre-package 100 are precisely defined by the lateral dimensions of the surfaces 121S, 125S and the frame structure 127.

The pre-package 100 as illustrated in FIGS. 1 and 2 may be formed based on the following processes.

The flexible printed circuit board 110 may typically be provided as a roll material and may appropriately be stamped so as to obtain the non-planar circuit portion 111 having the predetermined height 111H and predetermined lateral size and shape. The one or more components 112 may be attached to the flexible printed circuit board 110 at any appropriate manufacturing stage, for example after having stamped the respective carrier material of the printed circuit board 110 by any appropriate technique, such as gluing, soldering, and the like. The layers 122, 123 may be prepared to correspond in shape and thickness to the specific requirements of the pre-package 100, and these layers, which may also be provided in the form of a roll material, may be attached to each other and to the circuit board 110. This may be accomplished in a state, in which any of these material layers is still provided in the form of a roll material.

It should be appreciated that any coatings or free films, such as the coatings 122A and 123A may be applied at any appropriate manufacturing stage prior to attaching the material layers 122, 123 to the circuit board 110. The frame layer 124, including the respective films and coatings 124A, 124B may be prepared separately and may also be attached to the circuit board 110, followed by the attachment of the frame structure 127 and the top and bottom layers, possibly in combination with the respectively applied coatings 121S, 125S. Thereafter, appropriate process conditions may be established, for instance by applying heat and pressure for a specific time period in order to laminate the various material layers and obtain the layer stack 120 (cf. FIG. 1) having the substantially planar surfaces 121S, 125S. It should be appreciated that during the corresponding manufacturing process the process conditions may selected so as to not unduly affect in particular the component 112, which may require the application of a reduced lamination temperature of for example 120° C. or less, when the layer stack 120 is provided in the form of PVC materials. Similarly, the corresponding mechanical external pressure may be selected to avoid any mechanical damage of the component 112, wherein, as discussed above, in particular the frame layer 124 and the frame structure 127 may act to restrict the resulting pressure acting on the component 112 to a desired non-critical amount.

Figure 3:
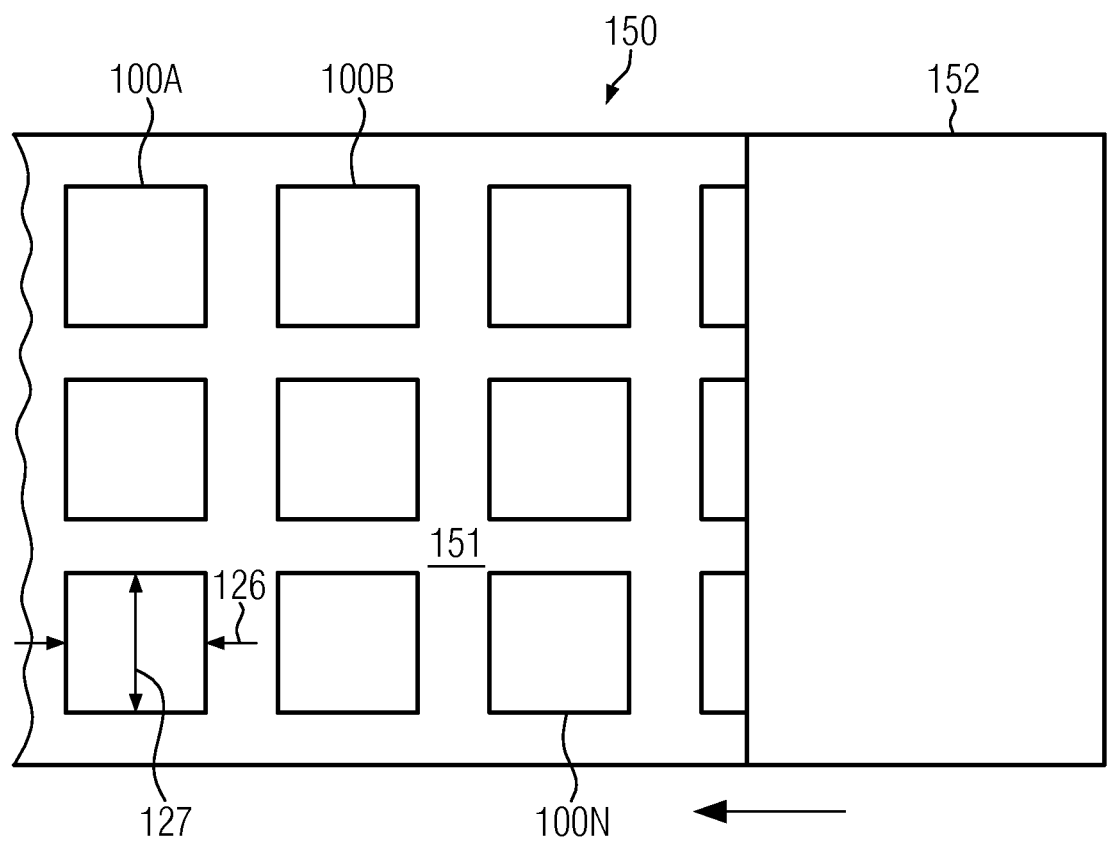

FIG. 3 schematically illustrates a top view of a precursor sheet material 150 that may be used for forming smartcards or respective pre-forms thereof. The precursor sheet material 150 is, in some illustrative embodiments, as shown in FIG. 3, provided in the form of a roll material 152, wherein a plurality of respective pre-packages 100A, . . . , 100N are provided in accordance with features and characteristics, as discussed above in the context of FIGS. 1 and 2. Consequently, the plurality of pre-packages 100A, . . . , 100N that are mechanically connected by an appropriate carrier material 151 are formed with well-defined lateral dimensions 126, 127, which may be significantly less compared to the lateral dimensions of a respective smartcard or a pre-form thereof. Consequently, due to the reduced lateral dimensions 126, 127, i.e., the reduced form factor of the pre-package compared to the form factor of the final smartcard, increased precision of the pre-package in general may be achieved, thereby also enabling a highly precise positioning of the corresponding component 112 (cf. FIG. 1), while also specifically selected overall process conditions for forming the pre-packages 100A, . . . , 100N contribute to superior process yield and product reliability.

Based on the precursor sheet material 150 the pre-packages 100A, . . . , 100N may be further processed for being used in smartcards or pre-forms thereof by being cut out from the carrier material 151 on the basis of any appropriate technique. Consequently, individual pre-packages 100A, . . . , 100N may be obtained from the precursor sheet material 150 for further processing.

Figure 4:
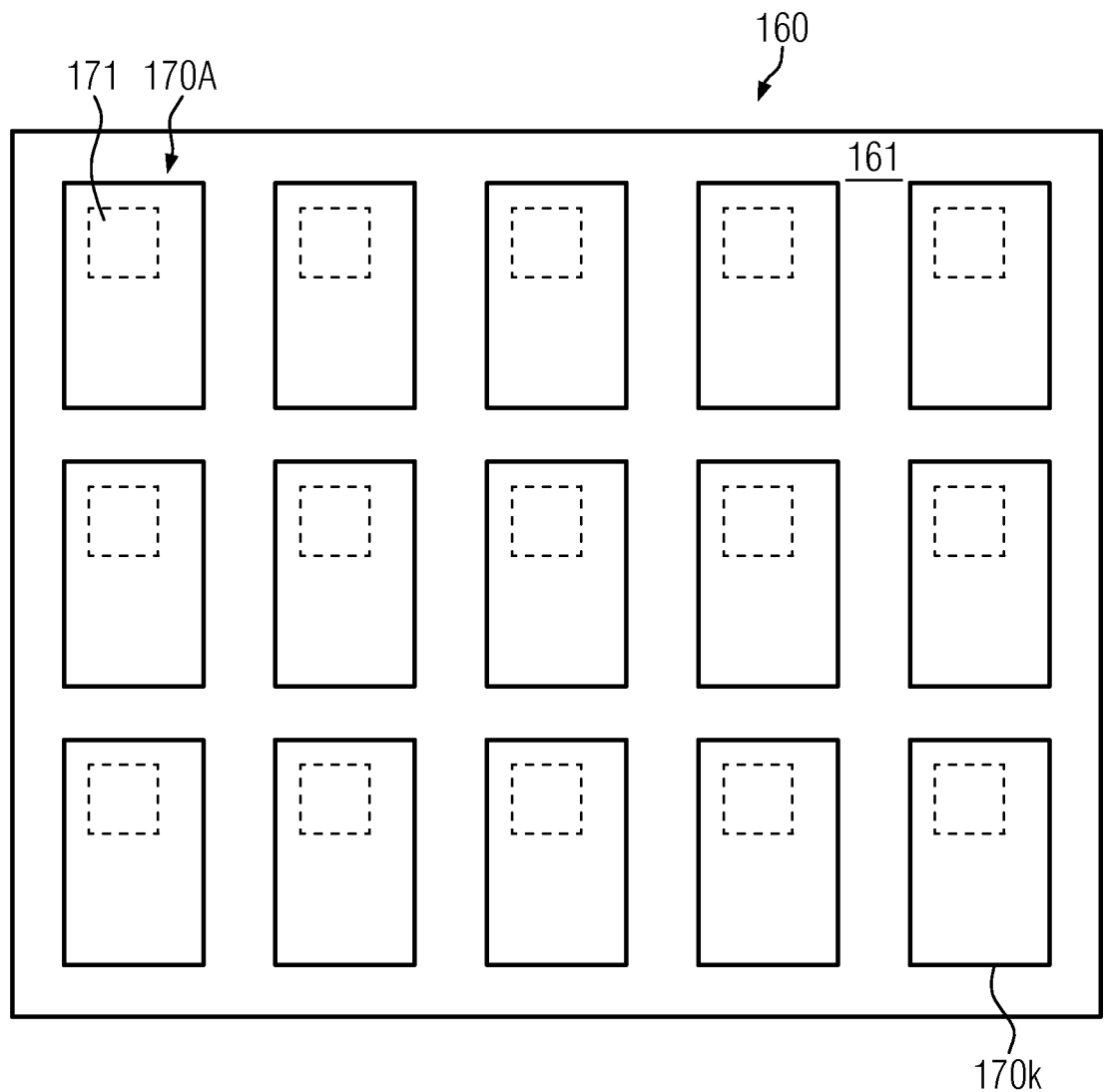

FIG. 4 schematically illustrates a top view of a plurality of pre-forms 170A, . . . , 170K for smartcards. As illustrated, the array of pre-forms 170A, . . . , 170K is provided as a sheet of material 160, wherein the individual pre-forms 170A, . . . , 170K are mechanically interconnected by a respective carrier material 161. The pre-forms 170A, . . . , 170K may be processed in parallel based on process conditions to mutually connect the plurality of material layers, which have possibly incorporated additional components, such as antennas for RFID devices, electronic modules, and the like. Typically, the process conditions for forming the pre-forms 170A, . . . , 170K may be selected differently compared to the process conditions applied during the manufacturing process for forming the pre-packages 100A, . . . , 100N in FIG. 3, since typically at least one of the components 112 (cf. FIG. 1) may be more sensitive with respect to process temperature, pressure, and the like, as discussed above.

Furthermore, the pre-forms 170A, . . . , 170K may receive respective portions or openings 171, which correspond in lateral size and shape to pre-packages 100A, . . . , 100N in order to enable appropriate insertion of the pre-packages and attachment to the surrounding material of the pre-forms 170A, . . . , 170K. It should be appreciated that respective adhesive or fill materials may be attached to the pre-packages 100A, . . . , 100N and/or to the confining areas of the openings 171 in order to enable appropriate attachment of the pre-packages. To this end, any appropriate process conditions may be applied upon inserting the individual pre-packages into the respective openings 171 of the pre-forms 170A, . . . , 170K. After having finished the pre-forms 170A, . . . , 170K, which are still interconnected by the carrier material 161, the sheet material 160 may be supplied to a card manufacturer, who may form the final cards from the pre-forms 170A, . . . , 170K that include the respective pre-packages 100A, . . . , 100N, as discussed above.

Figure 5A:
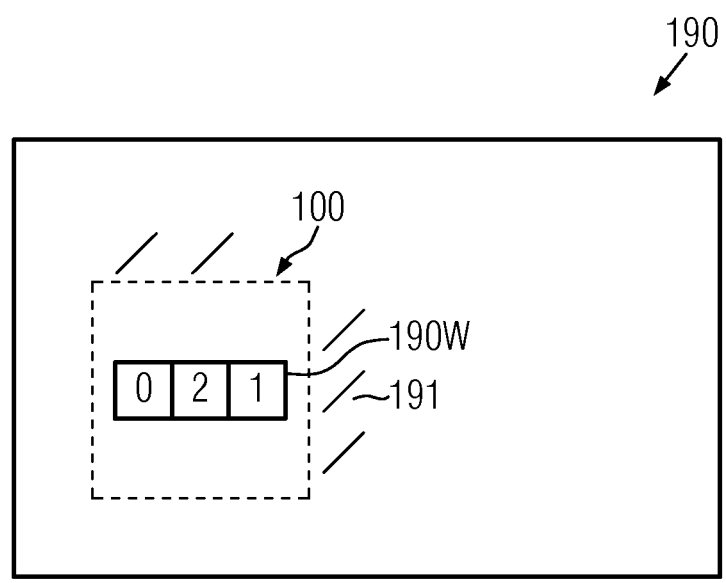

FIG. 5A schematically illustrates a top view of a smartcard 190 according to illustrative embodiments. As already discussed above, the term smartcard should be understood as comprising any card-type device, in which lateral dimensions are significantly greater than respective height dimensions or thickness of the smartcard. For example, payment cards and the like, which are typically defined by international standards, any type of RFID labels including electronic components, and the like, may represent respective smartcards in the sense of the present invention.

The smartcard 190 has incorporated therein the pre-package 100 including a respective component, such as the component 112 as shown in FIG. 1. For example, the component 112 of FIG. 1 may represent a display that may optically be accessible by a card window 190W. Consequently, respective symbols generated on the display 112 may be visible through the card window 190W, thereby imparting superior functionality and/or security to the smartcard 190. For example, in the field of credit cards or other payment cards a so-called card verification value (CVV) may typically be provided in order to achieve superior security upon performing online transactions. In order to increase overall security of online transactions it has been proposed to periodically change the CVV and to display the value, possibly upon user request, by means of a display.

It should be appreciated, however, that additionally or alternatively a display may be provided to display any other symbols, characters, text and/or graphics in order to achieve superior optical appearance and/or additional functionality.

Moreover, in the embodiment shown in FIG. 5A a card portion 191 is formed adjacent to portion corresponding to the pre-package 100, wherein both portions have very similar characteristics, for instance in terms of thermal conductivity, and the like, thereby ensuring consistent behaviour during the further processing of the smartcard, for instance when printing symbols onto or into the portion 191 and possibly on the portion associated with the pre-package 100. Similarly, as previously discussed, the pre-package 100 may be formed, at least at portions that may be contact with the remaining card materials of the smartcard 190, of any smartcard compatible material in order to achieve a consistent behaviour between the pre-package 100 and the neighbouring portion 191 during the further processing and finalizing of the smartcard 190.

Figure 5B:
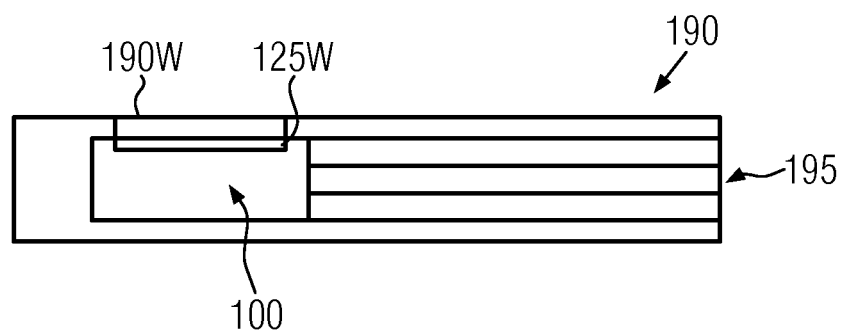

FIG. 5B schematically illustrates a cross-sectional view of the smartcard 190 according to illustrative embodiments. As shown, a stack of card layers 195, a portion of which may correspond to the material layers of the pre-forms 170A, . . . , 170K of FIG. 4 and discussed in the context of FIGS. 1 and 2, may have embedded therein the pre-package 100 having the characteristics and features as previously discussed. In particular, the window 125W (cf. FIG. 1) may be provided to be aligned to the card window 190W in order to allow access to a specific component of the pre-package 100, as discussed above.

The smartcard 190 may be formed from the pre-forms 170A, . . . , 170K by attaching two or more additional card layers of the stack 195, while also providing additional features, such as printed portions, embossed portions, paint, and the like, in order to comply with customer specific requirements. Consequently, the smartcard 190 may be provided with desired additional components, such as a display, and the like, wherein the pre-package 100 ensures high reliability of the final product, since generally overall process robustness may be enhanced by forming the pre-package 100 separately from the remaining portion of the smartcard or its pre-form. Furthermore, specific process conditions may be selected for the pre-package 100, while the remaining smartcard 190 or its pre-form may be formed based on different process conditions, if considered necessary. Generally, the decoupling of the manufacturing of the pre-package 100 from the remaining pre-form allows the application of volume production techniques, for instance, by providing the pre-packages as a roll material during the processing of the pre-packages and the subsequent incorporation of the separated pre-packages into the pre-forms on the basis of well-defined overall dimensions, thereby also contributing to enhanced reliability of the overall manufacturing process.

The invention claimed is:

1. A pre-package for a smartcard, comprising
   a flexible printed circuit board including at least one non-planar circuit portion; and
   a stack of material layers that accommodates said flexible printed circuit board to provide a top surface and a bottom surface of said stack of material layers that are planar.

2. The pre-package of claim 1, wherein pre-package has pre-determined lateral dimensions that are defined by said top surface and bottom surface.

3. The pre-package of claim 1, wherein pre-package has a height dimension orthogonal to said lateral dimensions, and wherein said height dimension is less than 0.8 mm.

4. The pre-package of claim 1, wherein at least a material forming portions of at least one of said top surface and said bottom surface is a material as used for smartcards.

5. The pre-package of claim 4, wherein said material forming portions of at least one of said top surface and said bottom surface comprises at least one of PVC, polycarbonate, PET-G, ABS and PET.

6. The pre-package of claim 1, wherein said flexible printed circuit board comprises at least one of a display, a keyboard, a sensor, a battery, an optical component and an electronic component.

7. The pre-package of claim 1, wherein said stack of layers comprises a frame layer that surrounds at least a portion of said at least one non-planar circuit portion.

8. The pre-package of claim 7, wherein at least one of said top layer and said bottom layer includes a window portion that is aligned to at least a portion of an opening of said frame layer.

9. The pre-package of claim 1, wherein said stack of material layers includes a top layer forming at least a portion of said planar top surface and a bottom layer forming at least a portion of said planar bottom surface.

10. The pre-package of claim 1, further comprising a frame sidewall structure that laterally encloses a central portion of said stack of material layers and that is laterally aligned to said top surface and said bottom surface to define said pre-determined lateral dimension throughout a height direction of said pre-package.

11. A precursor sheet material for forming smartcards, comprising
    an array of pre-packages of claim 1; and
    a substrate material mechanically interconnecting said pre-packages of said array.

12. The precursor sheet material of claim 11, wherein said precursor sheet material is provided in the form of a roll.

13. A smartcard, comprising
    a stack of card layers; and
    a pre-package of claim 1 that is embedded in said stack of card layers.

14. The smartcard of claim 13, wherein said stack of card layers includes a printed portion formed of a first material and wherein a portion of said pre-package positioned adjacent to said printed portion is formed of a second material that has substantially same thermal characteristics as said first material.

15. The smartcard of claim 14, wherein said first and second materials are substantially identical in their basic chemical composition.

16. The smartcard of claim 13, wherein said pre-package has a window and said smartcard includes a card window that is at least partially aligned with said window.

17. The smartcard of claim 16, wherein said card window is configured to enable at least one of a mechanical interaction, optical interaction, visibility and electromagnetic interaction with said window of the pre-package.

18. A method of forming pre-packages for smartcards, the method comprising
- providing an array of flexible printed circuit boards mechanically interconnected by a carrier material, each of said flexible printed circuit boards including at least one non-planar circuit portion;
- attaching said array of flexible printed circuit boards to a first layer of a smartcard compatible material;
- laterally enclosing at least said non-planar circuit portion of each of said flexible printed circuit boards in said array by attaching, for each of said non-planar circuit portions, a respective frame layer to said first layer, each of said frame layers having an opening so as to accommodate at least said respective non-planar circuit portion and level, at least partially, a non-planarity of said respective non-planar circuit portion;
- attaching a second layer formed of said smartcard compatible material to said first layer so as to form a planar bottom surface; and
- attaching a third layer formed of said smartcard compatible material to said frame layers so as to form a planar top surface.

19. The method of claim 18, further comprising preparing in advance said frame layers in accordance with lateral and height dimensions of said flexible printed circuit boards.

20. The method of claim 18, wherein said array of said flexible printed circuit boards is provided in the form of a roll material and wherein said first, second and third layers formed of said smartcard compatible material are provided in the form of a roll material.

\* \* \* \* \*